US012657442B2

(12) United States Patent
Vorenkamp et al.

(10) Patent No.: US 12,657,442 B2
(45) **Date of Patent: *Jun. 16, 2026**

(54) NEUROMORPHIC SYNTHESIZER

(71) Applicant: SYNTIANT, Irvine, CA (US)

(72) Inventors: Pieter Vorenkamp, Laguna Beach, CA (US); Kurt F. Busch, Laguna Hills, CA (US); Stephen W. Bailey, Irvine, CA (US); Jeremiah H. Holleman, III, Davidson, NC (US)

(73) Assignee: SYNTIANT, Irvine, CA (US)

( * ) Notice: Subject to any disclaimer, the term of this patent is extended or adjusted under 35 U.S.C. 154(b) by 945 days.

This patent is subject to a terminal disclaimer.

(21) Appl. No.: 17/892,876

(22) Filed: Aug. 22, 2022

(65) Prior Publication Data

US 2022/0414439 A1 Dec. 29, 2022

Related U.S. Application Data

(63) Continuation of application No. 16/039,142, filed on Jul. 18, 2018, now Pat. No. 11,423,288.

(Continued)

(51) Int. Cl.
*G06N 3/063* (2023.01)
*G06F 30/327* (2020.01)

(Continued)

(52) U.S. Cl.
CPC ........... *G06N 3/063* (2013.01); *G06F 30/327* (2020.01); *G06F 30/36* (2020.01); *G06N 3/0442* (2023.01);

(Continued)

(58) Field of Classification Search
CPC ........ G06N 3/063; G06N 3/044; G06N 3/045; G06N 3/065; G06N 3/08; G06N 3/105;

(Continued)

(56) References Cited

U.S. PATENT DOCUMENTS 6,424,959 B1 7/2002 Bennett et al.
2011/0119214 A1 5/2011 Breitwisch et al.

(Continued)

OTHER PUBLICATIONS

PCT Search Report, PCT Application No. PCT/US2018/042749, dated Nov. 28, 2018.

(Continued)

*Primary Examiner* — Paul Dinh
(74) *Attorney, Agent, or Firm* — Rutan & Tucker LLP; Hani Z. Sayed; Ravi Mohan

(57) ABSTRACT

Disclosed herein is a method for automatically generating an integrated circuit. The method includes receiving a behavioral description of at least the first layer of the neural network, converting the behavioral description of the first layer of the neural network into the computational graph, converting a computational graph to a circuit netlist based on a correlation of: (i) operations described in the computational graph, and (ii) an analog cell library including a plurality of predetermined circuit blocks that describe known neural network operations, generating a circuit layout that corresponds to at least a first layer of a neural network, and performing additional actions configured to cause generation of the integrated circuit based on the circuit layout. In some situations, the behavioral description defines an architecture of machine learning logic that represents at least a portion of the neural network. Additionally, in some situations, each cell of the integrated circuit includes a metal-oxide-semiconductor field-effect transistor ("MOSFET").

20 Claims, 3 Drawing Sheets

Related U.S. Application Data

(60) Provisional application No. 62/534,188, filed on Jul. 18, 2017.

(51) Int. Cl.

| | |
|---|---|
| ***G06F 30/36*** | (2020.01) |
| ***G06N 3/0442*** | (2023.01) |
| ***G06N 3/065*** | (2023.01) |
| ***G06N 3/10*** | (2006.01) |
| ***H10D 84/01*** | (2025.01) |

(52) U.S. Cl.
CPC ............. *G06N 3/065* (2023.01); *G06N 3/105* (2013.01); *H10D 84/01* (2025.01)

(58) Field of Classification Search
CPC ...... G06F 30/327; G06F 30/36; G06F 30/347; G06F 30/393; G06F 30/394; H10D 84/01
USPC .......................................................... 716/100
See application file for complete search history.

(56) References Cited

U.S. PATENT DOCUMENTS

| | | | | |
|---|---|---|---|---|
| 2014/0282180 | A1 | 9/2014 | Orofino | |
| 2015/0286766 | A1 | 10/2015 | Singh et al. | |
| 2023/0252215 | A1 * | 8/2023 | Zhang .................. | G06F 30/327 716/100 |

OTHER PUBLICATIONS

Joshi, M., “Implementation of an Integrated Artificial Neural Network trained with Back Propagation Algorithm, Master of Technology in VLSI Design”, 2012, accessed from http:I/117.203.246.91:8080/jspul/bitstream/10266/1837/3/1837.pdf (Year: 2012).

Rampasek, L. et al., “TensorFlow: Biology’s Gateway to Deep Learning?”, Cell Systems, vol. 2, Issue 1, 2016, pp. 12-14, ISSN 2405-4712, https://doi.org/10.1016/j.cels.2016.01.009 (Year: 2016).

* cited by examiner

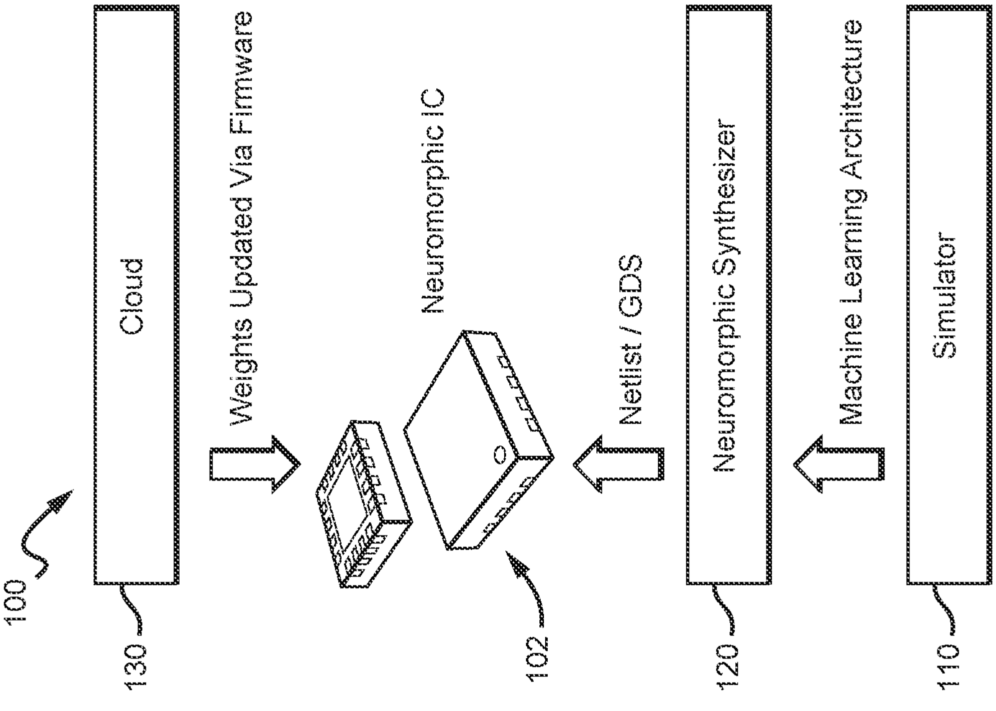

FIG. 1

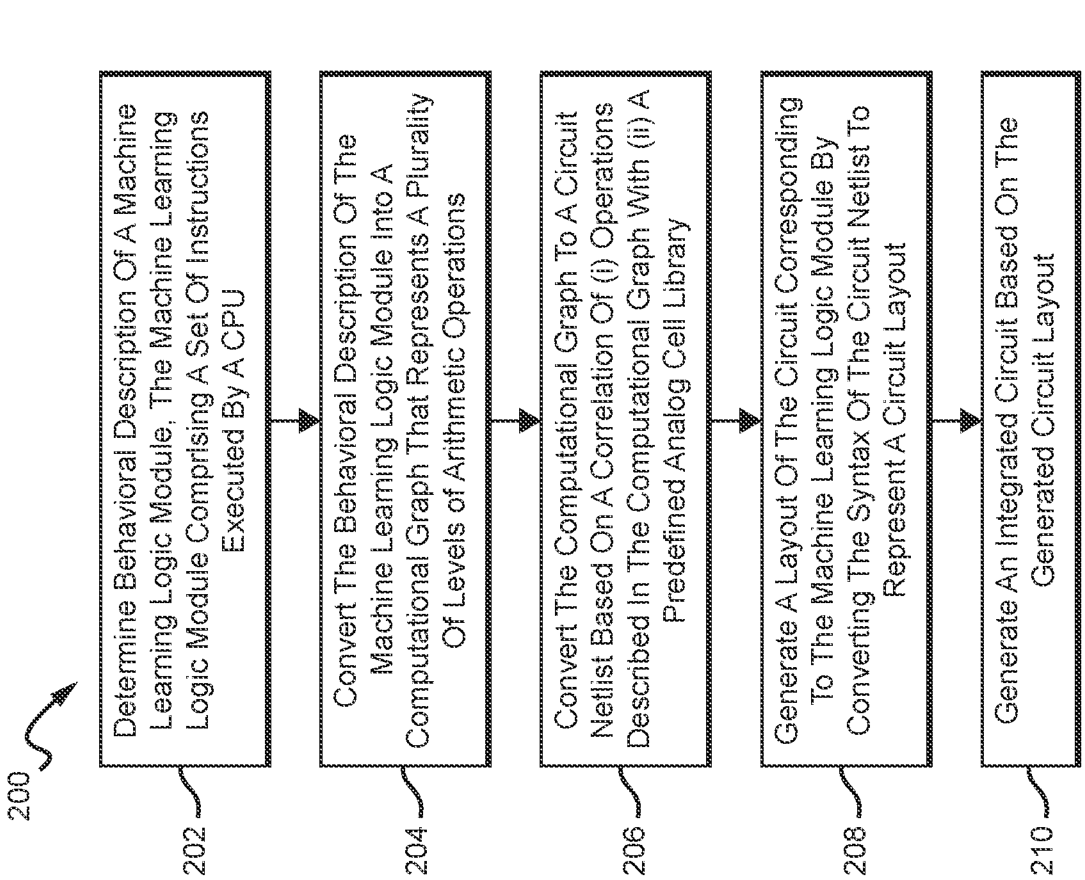

202  Determine Behavioral Description Of A Machine Learning Logic Module, The Machine Learning Logic Module Comprising A Set Of Instructions Executed By A CPU 204  Convert The Behavioral Description Of The Machine Learning Logic Module Into A Computational Graph That Represents A Plurality Of Levels of Arithmetic Operations 206  Convert The Computational Graph To A Circuit Netlist Based On A Correlation Of (i) Operations Described In The Computational Graph With (ii) A Predefined Analog Cell Library 208  Generate A Layout Of The Circuit Corresponding To The Machine Learning Logic Module By Converting The Syntax Of The Circuit Netlist To Represent A Circuit Layout 210  Generate An Integrated Circuit Based On The Generated Circuit Layout

100

130  Cloud

Weights Updated Via Firmware

Neuromorphic IC

102

Netlist / GDS

120  Neuromorphic Synthesizer

Machine Learning Architecture

110  Simulator

300

302 — Determine Computational Graph Of A Plurality Of Levels Of Arithmetic Operations Representing A Machine Learning Logic Module Including At Least A Portion Of A Neural Network 304 — For Each Computational Element Implementing An Operation In The Computational Graph, A Circuit Block That Implements The Desired Computational Operation Is Selected From A Predetermined Library Of Circuit Blocks 306 — For Each Connection Connecting Components In The Computational Graph, Creating A Corresponding Connection That Connects The Circuit Blocks Implementing Corresponding Computational Elements

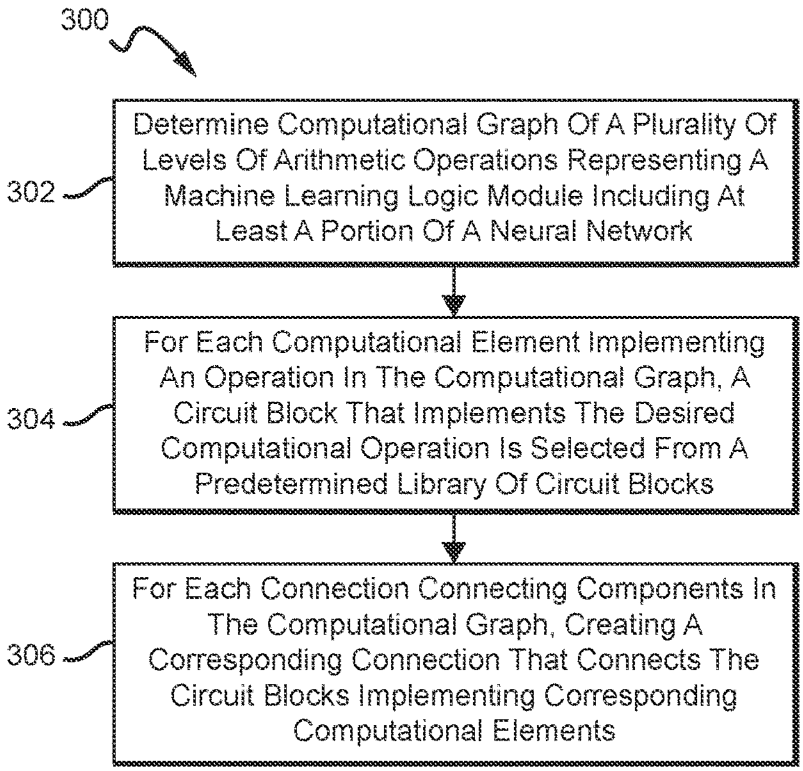

Neuromorphic Synthesizer System

Processor(s)

501

Non-Transitory Computer-Readable Medium

502

Analog Cell Library
504

Neural Network Description Parsing Logic
506

Neural Network Module Generation Logic
508

Circuit Layout Generation Logic
510

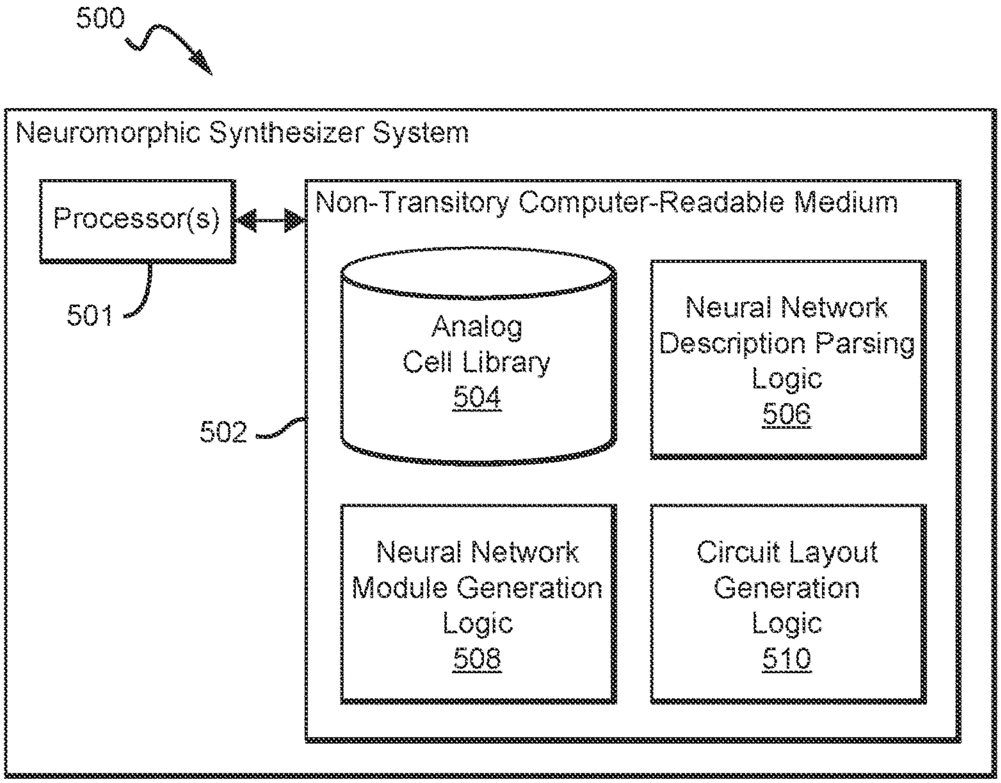

*FIG. 5*

NEUROMORPHIC SYNTHESIZER

PRIORITY

This application is a continuation of and claims the benefit of priority to U.S. patent application Ser. No. 16/039,142, filed Jul. 18, 2018, now issued U.S. Pat. No. 11,423,288, which claims priority to U.S. Provisional Application No. 62/534,188, filed Jul. 18, 2017, the entire contents of which are incorporated by reference herein.

FIELD

Embodiments of the disclosure related to the field of neuromorphic computing. More specifically, embodiments of the disclosure relate to systems and methods for automatic and computerized conversion of a behavioral description of a machine learning logic module into an integrated circuit design.

BACKGROUND

Traditional central processing units (CPUs) process instructions based on "clocked time." Specifically, CPUs operate such that information is transmitted at regular time intervals. Based on complementary metal-oxide-semiconductor (CMOS) technology, silicon-based chips may be manufactured with more than 5 billion transistors per die and may be as small as 10 nm. Advances in CMOS technology have been parlayed into advances in parallel computing, which is used ubiquitously in cell phones and personal computers containing multiple processors.

However, as machine learning is becoming commonplace for numerous applications including bioinformatics, computer vision, video games, marketing, medical diagnostics, online search engines, etc., traditional CPUs are often not able to supply a sufficient amount of processing capability while keeping power consumption low. In particular, machine learning is a subsection of computer science directed to software having the ability to learn from and make predictions on data. Furthermore, one branch of machine learning includes deep learning, which is directed at utilizing deep (multilayer) neural networks.

Currently, research is being done to develop direct hardware implementations of deep neural networks, which may include systems that attempt to simulate "silicon" neurons (e.g., "neuromorphic computing"). Neuromorphic chips (e.g., silicon computing chips designed for neuromorphic computing) operate by processing instructions in parallel (e.g., in contrast to clocked time) using bursts of electric current transmitted at non-uniform intervals. As a result, neuromorphic chips require far less power to process information, specifically, artificial intelligence (AI) algorithms. To accomplish this, neuromorphic chips may contain as much as five times as many transistors as a traditional processor while consuming up to 2000 times less power. As one example of neuromorphic chips, IBM has developed a chip (deemed "TrueNorth") that implements one million spiking neurons and 256 million synapses on a chip with 5.5 billion transistors with an average power usage of 70 milliwatts. Thus, the development of neuromorphic chips is directed to provide a chip with vast processing capabilities that consumes far less power than conventional processors. Further, neuromorphic chips are designed to support dynamic learning in the context of complex and unstructured data.

Specifically, neuromorphic chips are designed to simulate and/or mimic neuro-biological architectures present in the nervous system. For example, a memristor is intended to mimic a synapse in the human nervous system. A memristor, e.g., a two-terminal element, has two properties of particular importance: switching and plasticity.

Further, a neuristor is intended to mimic neuron within a human nervous system. A neuristor may be designed with capacitors in parallel with memristors. Neuristors provide two important functions: integration and threshold spiking. The integration, supplied by the capacitance, and spiking function can be engineered into a single two-terminal memristor.

BRIEF DESCRIPTION OF THE DRAWINGS

Embodiments of this disclosure are illustrated by way of example and not by way of limitation in the figures of the accompanying drawings, in which like references indicate similar elements and in which:

FIG. 1 provides a schematic illustrating a system 100 for designing and updating neuromorphic integrated circuits ("ICs") in accordance with some embodiments.

FIG. 2 is an exemplary flowchart illustrating a computerized method 200 of automatically generating a circuit layout from a behavioral description of machine learning logic.

FIG. 3 is an exemplary flowchart illustrating a computerized method 300 of automatically generating a circuit netlist from a computational graph representing machine learning logic.

FIG. 5 is a block diagram of a neuromorphic synthesizer system 500.

DETAILED DESCRIPTION

Figure 4:
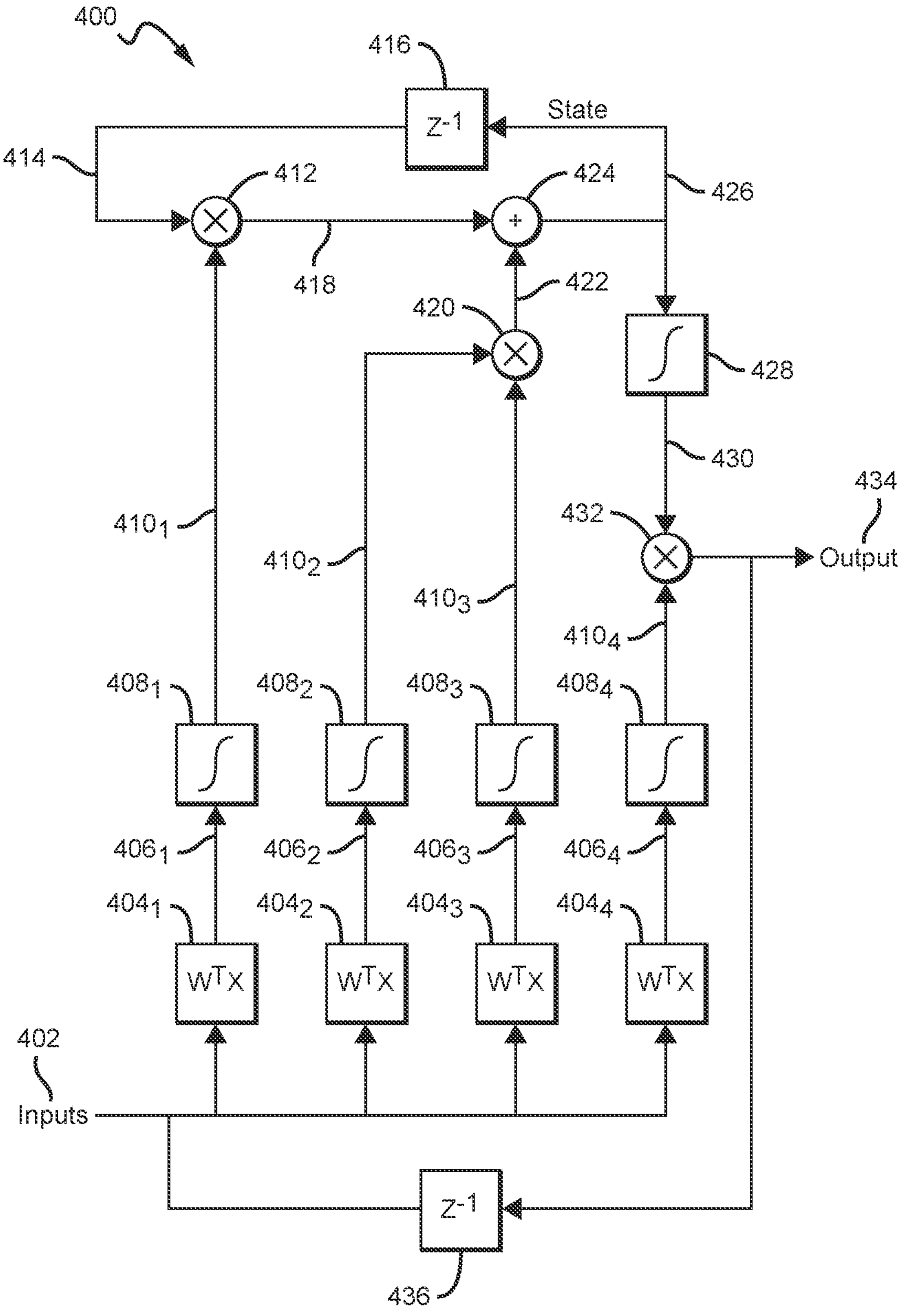
FIG. 4 is a block diagram illustrating an exemplary computational graph in the form of a long-short term memory (LSTM) circuit.

In the following description, certain terminology is used to describe features of the invention. For example, in certain situations, the term "logic" may be representative of hardware, firmware and/or software that is configured to perform one or more functions. As hardware, logic may include circuitry having data processing or storage functionality. Examples of such circuitry may include, but are not limited or restricted to a microprocessor, one or more processor cores, a programmable gate array, a microcontroller, a controller, an application specific integrated circuit, wireless receiver, transmitter and/or transceiver circuitry, semiconductor memory, or combinatorial logic.

The term "process" may include an instance of a computer program (e.g., a collection of instructions, also referred to herein as an application). In one embodiment, the process may be included of one or more threads executing concurrently (e.g., each thread may be executing the same or a different instruction concurrently).

The term "processing" may include execution of a binary or script, or launching an application in which an object is processed, wherein launching should be interpreted as placing the application in an open state and, in some implementations, performing simulations of actions typical of human interactions with the application. In some embodiments, processing may be a combinations of operations (e.g., actions) performed as a result of execution of logic.

The term "object" generally refers to a collection of data, whether in transit (e.g., over a network) or at rest (e.g., stored), often having a logical structure or organization that enables it to be categorized or typed. Herein, the terms "binary file" and "binary" will be used interchangeably.

The term "file" is used in a broad sense to refer to a set or collection of data, information or other content used with a computer program. A file may be accessed, opened, stored, manipulated or otherwise processed as a single entity, object or unit. A file may contain other files, and may contain related or unrelated contents or no contents at all. A file may also have a logical format, and/or be part of a file system having a logical structure or organization of plural files. Files may have a name, sometimes called simply the "file-name," and often appended properties or other metadata. There are many types of files, such as data files, text files, program files, and directory files. A file may be generated by a user of a computing device or generated by the computing device. Access and/or operations on a file may be mediated by one or more applications and/or the operating system of a computing device. A filesystem may organize the files of the computing device of a storage device. The filesystem may enable tracking of tiles and enable access of those files. A filesystem may also enable operations (e.g., actions) on a file. In some embodiments the operations on the file may include file creation, file modification, file opening, file reading, file writing, file closing, and file deletion.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Referring now to FIG. 1, a schematic illustrating a system 100 for designing and updating neuromorphic integrated circuits ("ICs") is provided in accordance with some embodiments. As shown, the system 100 can include a simulator 110, a neuromorphic synthesizer 120, and a cloud 130 configured for designing and updating neuromorphic ICs such as neuromorphic IC 102. As further shown, designing and updating neuromorphic ICs can include creating a machine learning architecture with the simulator 110 based on a particular problem. The neuromorphic synthesizer 120 can subsequently transform the machine learning architecture into a netlist directed to the electronic components of the neuromorphic IC 102 and the nodes to which the electronic components are connected. In addition, the neuromorphic synthesizer 120 can transform the machine learning architecture into a graphic database system ("GDS") file detailing the IC layout for the neuromorphic IC 102. From the netlist and the GDS file for the neuromorphic IC 102, the neuromorphic IC 102, itself, can be fabricated in accordance with current IC fabrication technology. Once the neuromorphic IC 102 is fabricated, it can be deployed to work on the particular problem for which it was designed. While the initially fabricated neuromorphic IC 102 can include an initial firmware with custom synaptic weights between the nodes, the initial firmware can be updated as needed by the cloud 130 to adjust the weights. Being as the cloud 130 is configured to update the firmware of the neuromorphic IC 102, the cloud 130 is not needed for everyday use.

Neuromorphic ICs such as the neuromorphic IC 102 can be up to 100× or more energy efficient than graphics processing unit ("GPU") solutions and up to 280× or more energy efficient than digital CMOS solutions with accuracies meeting or exceeding comparable software solutions. This makes such neuromorphic ICs suitable for battery powered applications.

Neuromorphic ICs such as the neuromorphic IC 102 can be configured for application specific standard products ("ASSP") including, but not limited to, keyword spotting, speaker identification, one or more audio filters, gesture recognition, image recognition, video object classification and segmentation, or autonomous vehicles including drones. For example, if the particular problem is one of keyword spotting, the simulator 110 can create a machine learning architecture with respect to one or more aspects of keyword spotting. The neuromorphic synthesizer 120 can subsequently transform the machine learning architecture into a netlist and a GDS file corresponding to a neuromorphic IC for keyword spotting, which can be fabricated in accordance with current IC fabrication technology. Once the neuromorphic IC for keyword spotting is fabricated, it can be deployed to work on keyword spotting in, for example, a system or device.

Neuromorphic ICs such as the neuromorphic IC 102 can be deployed in toys, sensors, wearables, augmented reality ("AR") systems or devices, mobile systems or devices, appliances, Internet of things ("IoT") devices, or hearables.

Referring now to FIG. 2, an exemplary flowchart illustrating a computerized method 200 of automatically generating a circuit layout from a behavioral description of machine learning logic is shown. Each block illustrated in FIG. 2 represents an operation performed in the computerized method 200 of performing an automatic circuit layout generation. At block 202, a behavioral description of a machine learning logic module is determined. The behavioral description may comprise machine code, e.g., a set of one or more instructions that may be executed by a CPU, that defines an architecture of the machine learning logic module. In one embodiment, the machine learning logic module may represent at least a portion of a neural network.

At block 204, the behavioral description of the machine learning logic module is converted into a computational graph that represents a plurality of levels of operations. Of these operations, some may be referred to as "primitive operations" such as add, multiply, half-wave rectification (often referred to in machine learning parlance as a Rectified Linear Unit, or ReLU), leaky ReLU, sigmoid, hyperbolic tangent function ("tanh"), winner-take-all (the output equal to the largest of multiple inputs), loser-take-all block (the output is equal to the smallest of several inputs), arg-max (the output indicates which of multiple inputs is the largest); arg-min (the output indicates which of multiple inputs is the smallest), averaging, exponentiation, logarithm, etc. For these primitive operations, there are corresponding analog circuits that implement the primitive operations in the analog circuit library. Further, complex operations may be comprised of a plurality of primitive operations, wherein examples of complex operations may include, but are not limited or restricted to, fully-connected layers, convolutions, matrix-vector multiplication, concatenation, vector addition, matrix inversion, LSTM layers, recurrent connections, gating units, delay operations, pooling operations, temporal convolutions, embedding layers, merge layers, and normalization. The primitive operations and complex operations may be referred to as "known neural network operations." Additional operations may be constructed from a combination of complex operations and primitive operations. In one embodiment, a software algorithm called TensorFlow may be used to convert the architecture of the machine learning logic module to the computational graph.

However, it should be noted that in alternative embodiments, one or more logic engines (or logic modules) may be provided a representation of a machine learning module, e.g., a portion of a neural network, which may be referred to as a "neural network description." In some embodiments, the neural network description may be an enumeration of layers, corresponding layer types and the connections between each layer. The logic engines may be configured to receive and parse the neural network description. The logic engines may then be configured to convert the parsed neural network description into a computational graph. For example, the logic engines may be configured to convert the neural network from first syntax or format to a second syntax or format, wherein the first syntax may be referred to as a neural network description and the second syntax may be referred to as a computational graph.

At block 206, the computational graph is converted into a circuit netlist based on a correlation of (i) operations described in the computational graph with (ii) a predetermined analog cell library representing computational operations. In some embodiments, the computational graph is comprised of a plurality of elements wherein each element corresponds directly to one or more circuit blocks within a circuit layout. The term "circuit block" refers to predetermined circuits that are part of a custom library. Each circuit block may have a fixed size or may be parametric. A parametric circuit block has a dynamic size that is defined by one or more parameters. For example, a circuit block, e.g., a memory array, might be instantiated with size parameters as follows, e.g.: "memory_array(rows=8, columns=16)." Such an example would result in an 8×16 array of core memory elements having eight input circuits with one input connected to each row and 16 output interface circuits with one connected to each column.

In one embodiment, a "fully connected layer" (e.g., within an integrated circuit) may be represented by one or more operations that multiply one input vector by a matrix of weights to yield one output vector. That matrix-vector multiplication corresponds to the operations performed by an array of memory elements. In such embodiments, the conversion of the computational graph to a circuit netlist includes, via a rules-based analysis, producing a representation of one or more circuit blocks based on arithmetic operations, including, but not limited or restricted to, vector-matrix multiplication operations that are representative of a machine learning logic module. In one such embodiment, a circuit element comprising a plurality of multipliers and summation circuitry and implementing a matrix-vector multiplication with parameters defining the number of inputs and outputs may exist within a pre-defined library, e.g., the analog cell library 504 of FIG. 5. In that case, the neuromorphic synthesizer system 500 of FIG. 5 might instantiate the pre-defined matrix-vector multiplication circuit with the appropriate parameters.

In a similar embodiment wherein a fully-connected layer is desired, and a complete matrix-vector multiplication circuit is not defined in the analog circuit library, but multiplication and summation elements do exist within the predefined library, the synthesizer might construct a matrix-vector multiplication circuit from the multiplication and summation elements according to a set of rules.

The following is "pseudo-code" illustrating one exemplary method of constructing a matrix-vector multiplication, however, the disclosure is not intended to be so limited.

```
function construct_mat_vector_mult (num_inputs, num_outputs) {
        for j= 1:num_outputs
            for i=1:num_inputs
```

-continued

```
        insert_multiplier(in1=input[i], in2=weight[i,j],
            out=product[i,j]);
              if i==1 then
        insert_adder(in1=product[i,j], in2=0, out=sum[i,j];
                  else
          connect(sum[i,j], product[i,j]);
        connect(sum[num_inputs, j], output[j]);
```

In other embodiments, an element in the computational graph may correspond to an entity that is to be generated using one or more elements within a circuit library. In such embodiments, representations of software routines will be stored within the circuit library, wherein each of the software routines expresses a given type of computational element (e.g., a convolution, or a recurrent layer) as a collection of circuit elements from a predefined and pre-populated analog cell library and the connections between those elements. In one embodiment, the analog cell library, stored in the non-transitory computer-readable as illustrated in FIG. 5, may include schematic representations of one or more elements as well as predefined circuit layouts, and/or physical implementation of each element. The layouts in the analog cell library will be designed to be compatible with the requirements of standard automatic place and route (P&R) tools. In one embodiment, the P&R tools may take as input a circuit netlist and properly designed layouts from the analog cell library and generate a layout of the larger circuit described by the netlist. In embodiments in which a P&R tool is not used to generate the circuit layout, one or more logic engines may be configured to place the circuit blocks and route wires for the connections. In some embodiments, the logic engines may be specific in configuration to identify a predetermined set of layer types (e.g. fully-connected, convolutional, recurrent, etc.). In such embodiments, the logic engines may be configured to place and route circuit blocks and route writes for the connections of the predetermined set of layer types.

In one non-limiting example, a long-short term memory (LSTM) is a type of layer often used in neural networks, that generally takes the form of the circuit shown in FIG. 4 (discussed below). The routine for a LSTM circuit would take parameters relating to the size of the inputs and outputs and the type of the nonlinearities and generates circuit netlist lines that lists each of the time delays, adders, multipliers, etc. and the connections between them.

In one example, an initial description of a neural network might include a statement that defines a specific layer to be an LSTM with an input comprising an X-dimensional vector ("Inputs 401" as seen in FIG. 4), a Y-dimensional state vector ("State 403" in FIG. 4), and a Z-dimensional output ("Output 418" in FIG. 4). The statement would then imply a computational graph like that illustrated in FIG. 4. The neuromorphic synthesizer system 500 may be configured to then parse a statement from a neural network description that calls for an LSTM layer and generate a circuit netlist corresponding to the configuration of elements shown in FIG. 4. Additional detail of the process for generating the circuit netlist is provided in FIG. 3. One or more logic engines may be configured to parse the initial description and, with respect to the statement defining an LSTM layer, generate a portion of a circuit netlist with circuit elements corresponding to the illustration of FIG. 4 and with wires corresponding to the lines in FIG. 4.

At block 208, a layout of a circuit, e.g., an IC, that corresponds to the machine learning logic module is generated by reformatting the syntax of the circuit netlist to represent a circuit layout. At optional block 210, an IC is generated using the layout of the circuit generated in block 208.

Referring now to FIG. 3, an exemplary flowchart illustrating a computerized method 300 of automatically generating a circuit netlist from a computational graph representing machine learning logic is shown. Each block illustrated in FIG. 3 represents an operation performed in the computerized method 300 of performing an automatic circuit netlist generation within the computerized method 200 of automatically generating a circuit layout. At block 302, a computational graph comprising a plurality of levels of mathematical operations representing a machine learning logic module is determined. In one embodiment, the machine learning logic module represents at least a portion of a neural network.

At block 304, for each computational element implementing an operation in the computational graph, a circuit block that implements the desired computational operation is selected from a predetermined library of circuit blocks. Subsequently, at block 306, for each connection connecting components in the computational graph, creating a corresponding connection that connects the circuit blocks implementing corresponding computational elements. However, it should be noted that not all circuit blocks need to be selected prior to creating one or more connections.

As one example, the method of FIG. 3 may be utilized to generate a circuit netlist describing a convolution operation. The convolution operation may be constructed based on the widely known definition of convolution, which a sequence of summations of multiplications of filter coefficients with pixel quantities and according to a rule-based construction method analogous to that described in the pseudo-code above. In some embodiments the pixels of the convolution operation are pixels from an image that is to be classified by the neural network. In another embodiment, the pixels may be elements of a "feature map," resulting from a convolution operation in a previous layer of the neural network. One illustration of a convolution includes operations performed on a patch of pixels having a first predetermined size and a filter having a second predetermined size is performed. In one embodiment, the patch of pixels may be a first rectangular patch of pixels representing by X pixels by Y pixels, wherein both X and Y may represent any integer. In one non-limiting embodiment, the patch of pixels may have a size of 80×60. In some embodiments, the filter may be a matrix having any size less than or equal to the size of the patch of pixels, e.g., a Z by Z filter. In one non-limiting embodiment, the filter may have a size of 3×3.

Generally, the patch of pixels may represent any element in a 2-D representation of an input. In particular, the patch of pixels represents at least a portion of an image (e.g., audio or graphic). In the case of an audio signal, prior to convolving the patch of pixels with the filter includes dividing the audio signal into frequency components, and maintaining a record of the value of each of the frequency (F) components at each of the last time (T) steps. The record may be stored in a non-transitory computer-readable medium as illustrated in FIG. 5.

In such an example, a patch of pixels may be defined as an (F)×(T) array of "pixels," such that each pixel indicates a particular amount of signal energy at a particular frequency at a particular time. Additionally, the filter may be used to recognize features or patterns in the image, wherein the patch of pixels represents a portion of the image. In one non-limiting example, the coefficients of the filter may be:

$$\begin{bmatrix} 1 & 0 & -1 \\ 1 & 0 & -1 \\ 1 & 0 & -1 \end{bmatrix}.$$

Such a sample filter may be used in detecting vertical edges with a brighter color on the left bordered by a darker color on the right. Continuing the example, the output of an operation applying the above filter is a second image where "bright spots" correspond to the existence in a certain location of the specific feature that the filter is programmed to detect. Subsequent layers may filter based on relationships between different features (e.g., an isolated dot below a vertical edge might be the character 'i' in a character recognition task).

It should be noted that an audio signal and an image pixel are just two examples of an input signal. Specifically, audio signals are often processed by first using a filter bank to measure the intensity of sound in various frequency bands and then performing operations on those frequency band energy levels.

Referring now to FIG. 4, a block diagram illustrating an exemplary computational graph, in the form of a long-short term memory (LSTM) circuit is shown. The LSTM circuit diagram 400 includes the following components: the matrix-vector operators $\mathbf{404}_1$-$\mathbf{404}_4$; the sigmoid vector operators $\mathbf{408}_1$-$\mathbf{408}_4$; the element-wise multiplier 412; the element-wise multiplier 420; the element-wise summation operator 424; the unit time delay element 416; the sigmoid vector operator 428; the element-wise multiplier 432; and the unit time delay element 436. The LSTM circuit diagram 400 receives the X-dimensional input vector 402, which is provided to the matrix-vector operators $\mathbf{404}_1$-$\mathbf{404}_4$. Following the operations of the matrix-vector operators $\mathbf{404}_1$-$\mathbf{404}_4$, output vectors $\mathbf{406}_1$-$\mathbf{406}_4$ are generated. The matrix-vector operators $\mathbf{404}_1$-$\mathbf{404}_4$ each apply a weight to the input vector 402, wherein one or more of the weights may differ from the others.

The output vectors $\mathbf{406}_1$-$\mathbf{406}_4$ are then provided to the sigmoid vector operators $\mathbf{408}_1$-$\mathbf{408}_4$, which each apply a saturating nonlinearity to a corresponding element in corresponding output vector $\mathbf{406}_1$-$\mathbf{406}_4$. The resultant vectors following the sigmoid vector operations are the output vectors $\mathbf{410}_1$-$\mathbf{410}_4$. The element-wise multiplier 412 takes as input output vector $\mathbf{410}_1$ along with the Y-dimensional state vector 426 at $\text{time}_n$ (wherein the Y-dimensional state vector 426 at $\text{time}_n$ is generated as a result of the input of the Y-dimensional state vector 426 at $\text{time}_{n-1}$ into the unit time delay element 416). The element-wise multiplier 412 generates as output the output vector 418.

The element-wise multiplier 420 takes as input the output vectors $\mathbf{410}_2$-$\mathbf{410}_3$ and generates the output vector 422. The element-wise summation operation 424 takes as input the output vectors 418 and 422, and generates the Y-dimensional state vector 426. As referenced above, the Y-dimensional state vector 426 is then provided to the unit time delay element 416 for feedback into the LSTM circuit diagram 400. Additionally, the Y-dimensional state vector 426 is provided to as input to the sigmoid vector operator 428, which generates the output vector 430. The element-wise multiplier 432 takes as input the output vector $\mathbf{410}_4$ and the output vector 430, and generates the Z-dimensional output vector 434. The output vector 434 may also be fed back into the LSTM circuit diagram via the unit time delay element 436.

Referring now to FIG. 5, a block diagram of a neuromorphic synthesizer system is shown. Herein, the neuromorphic synthesizer system 500 features a plurality of electronic components, including one or more hardware processors 501 (generally referred to as "processor"), at least one non-transitory computer-readable medium ("storage") 502 having information and logic stored thereon. Although not shown, these components may be encased in a housing, which may be made entirely or partially of a rigid material (e.g., hard plastic, metal, glass, composites, or any combination thereof) that protects these components from certain environmental conditions. As illustrated in FIG. 5, the processor 501 is circuitry that is configured to execute logic stored within the storage 502 to automatically convert a behavioral description of a machine learning logic module into an integrated circuit design. The non-transitory computer-readable medium may have stored thereon: an analog cell library 504, a neural network description parsing logic 506, a neural network module generation logic 508 and a circuit layout generation logic 510. The neural network description parsing logic 506 may be configured to identify standard neural network components, such as, for example, a fully-connected layer, a convolutional layer, or an LSTM layer, in a provided description of a neural network. The neural network description parsing logic 506 may also be configured to (i) convert the neural network description to a computational graph, (ii) convert the computational graph to a circuit netlist, and (iii) instantiate a corresponding integrated circuit that implements each neural network component and corresponding connection in the circuit netlist. The neural network module generation logic 508 may be parametric, e.g., receives input parameters, and may be configured to generate one or more neural network modules from available analog cells, e.g., stored in the analog cell library 504. The pseudo-code discussed above describing a circuit implementing a fully-connected layer is one example of such logic (e.g., the logic components illustrated in FIG. 5 provided as a single logic component). Similar routines for generating other types of neural network modules, such as convolutional layers or LSTM layers, would also be included.

In the foregoing description, the invention is described with reference to specific exemplary embodiments thereof. It will, however, be evident that various modifications and changes may be made thereto without departing from the broader spirit and scope of the invention as set forth in the appended claims.

What is claimed is:

1. A non-transitory computer readable storage medium having stored thereon instructions, the instructions being executable by one or more processors to perform actions comprising:

receiving a behavioral description of a first layer of a neural network comprising one or more corresponding layer types;

parsing the behavioral description using a logic engine and converting the behavioral description of a machine learning logic module to a computational graph representing a plurality of levels of operation that describe the first layer of the neural network to a circuit netlist based on a correlation of:

(i) operations described in the computational graph, and (ii) an analog cell library including a plurality of predetermined circuit blocks that describe known neural network operations; and generating a circuit layout that corresponds to at least the first layer of the neural network;

wherein the logic engine is configured to route circuit blocks of the one or more corresponding layer types.

2. The non-transitory computer readable storage medium of claim 1, wherein the instructions being executable by the one or more processors of to perform further actions comprising:

creating a corresponding connection that connects the circuit blocks implementing corresponding computational elements.

3. The non-transitory computer readable storage medium of claim 1, wherein the levels of operation comprise primitive and complex operations.

4. The non-transitory computer readable storage medium of claim 1, wherein generating the circuit layout includes converting syntax of the circuit netlist to a representation of a circuit layout.

5. The non-transitory computer readable storage medium of claim 1, wherein at least one circuit block is instantiated with size parameters.

6. The non-transitory computer readable storage medium of claim 1, wherein if the operations are not defined in the analog cell library, the conversion includes using a set of predetermined rules to generate the netlist.

7. The non-transitory computer readable storage medium of claim 1, wherein the instructions being executable by the one or more processors of to perform further actions comprising:

performing additional actions configured to cause generation of an integrated circuit based on the circuit layout.

8. The non-transitory computer readable storage medium of claim 1, wherein the behavioral description includes machine code being a set of one or more instructions that are executable by a computer processing unit (CPU).

9. The non-transitory computer readable storage medium of claim 1, wherein the behavioral description defines an architecture of machine learning logic that represents at least a portion of the neural network.

10. The non-transitory computer readable storage medium of claim 7, wherein the integrated circuit includes a plurality of cells, each cell including a metal-oxide-semiconductor field-effect transistor ("MOSFET").

11. The non-transitory computer readable storage medium of claim 1, wherein converting the computational graph to the circuit netlist further includes:

for each component element implementing an operation included in the computational graph, selecting one of the plurality of predetermined circuit blocks of the analog cell library that implements the operation.

12. A method for automatically generating an integrated circuit, the method comprising:

receiving a behavioral description of a first layer of a neural network comprising one or more corresponding layer types;

parsing the behavioral description using a logic engine and converting the behavioral description of a machine learning logic module to a computational graph representing a plurality of levels of operation that describe the first layer of the neural network to a circuit netlist based on a correlation of:

(i) operations described in the computational graph, and (ii) an analog cell library including a plurality of predetermined circuit blocks that describe known neural network operations; and generating a circuit layout that corresponds to at least the first layer of the neural network;

wherein the logic engine is configured to route circuit blocks of the one or more corresponding layer types.

13. The method of claim 12, wherein the instructions being executable by the one or more processors of to perform further actions comprising:

creating a corresponding connection that connects the circuit blocks implementing corresponding computational elements.

14. The method of claim 12, wherein the levels of operation comprise primitive and complex operations.

15. The method of claim 12, wherein generating the circuit layout includes converting syntax of the circuit netlist to a representation of a circuit layout.

16. The method of claim 12, wherein at least one circuit block is instantiated with size parameters.

17. The method of claim 12, wherein if the operations are not defined in the analog cell library, the conversion includes using a set of predetermined rules to generate the netlist.

18. The method of claim 12, wherein the instructions being executable by the one or more processors of to perform further actions comprising:

performing additional actions configured to cause generation of an integrated circuit based on the circuit layout.

19. The method of claim 12, wherein the behavioral description includes machine code being a set of one or more instructions that are executable by a computer processing unit (CPU).

20. The method of claim 12, wherein converting the computational graph to the circuit netlist further includes:

for each component element implementing an operation included in the computational graph, selecting one of the plurality of predetermined circuit blocks of the analog cell library that implements the operation.

* * * * *